(12) United States Patent
Wernham et al.

(10) Patent No.: US 8,018,652 B2
(45) Date of Patent: Sep. 13, 2011

(54) OPTICAL FILTER

(76) Inventors: Denny Wernham, Noordwijk (NL);
John Russell, Denbighshire (GB);
Glenn Morgan Jones, Denbighshire (GB)

( * ) Notice: Subject to any disclaimer, the term of this patent is extended or adjusted under 35 U.S.C. 154(b) by 1180 days.

(21) Appl. No.: 10/539,623

(22) PCT Filed: Dec. 18, 2003
(Under 37 CFR 1.47)

(86) PCT No.: PCT/EP03/51068
§ 371 (c)(1),
(2), (4) Date: Jul. 29, 2008

(87) PCT Pub. No.: WO2004/061490
PCT Pub. Date: Jul. 22, 2004

(65) Prior Publication Data
US 2009/0025783 A1 Jan. 29, 2009

(30) Foreign Application Priority Data
Dec. 19, 2002 (GB) .................................. 0229597.0

(51) Int. Cl.
*G02B 1/10* (2006.01)
*G02B 5/28* (2006.01)
*H01L 31/00* (2006.01)

(52) U.S. Cl. ......... 359/588; 359/359; 359/589; 136/257

(58) Field of Classification Search ................... 359/359, 359/586, 587, 588, 589; 136/257
See application file for complete search history.

(56) References Cited

U.S. PATENT DOCUMENTS

| | | | |
|---|---|---|---|
| 3,247,392 A | 4/1966 | Thelen | |
| 3,423,147 A | 1/1969 | Thelen | |
| 3,914,023 A | 10/1975 | Thelen | |
| 6,049,419 A * | 4/2000 | Wheatley et al. | 359/359 |
| 6,107,564 A | 8/2000 | Aguilera et al. | |
| 2005/0141093 A1* | 6/2005 | Weber | 359/584 |
| 2006/0262389 A1* | 11/2006 | Zaczek | 359/359 |

FOREIGN PATENT DOCUMENTS

| | | |
|---|---|---|
| EP | 0 567 735 | 11/1993 |
| EP | 0 567 735 A | 11/1993 |
| EP | 0 632 507 | 1/1995 |
| EP | 0 632 507 A | 1/1995 |

* cited by examiner

*Primary Examiner* — Alessandro Amari
(74) *Attorney, Agent, or Firm* — Lowe Hauptman Ham & Berner, LLP

(57) ABSTRACT

The present invention provides an optical filter including a substrate having a plurality of layers of materials stacked upon it each of which layers is formed from one or both of: a first material having a first index of refraction; and, a second material having a second index of refraction being less than the first index of refraction; wherein the plurality of layers of materials include a first layer and a second layer each formed from an inhomogeneous mixture of said first material and said second material; and a third layer formed from the first material being stacked in between the first layer and the second layer; wherein the optical thickness of each of said first and said second layers is greater than the optical thickness of said third layer.

33 Claims, 4 Drawing Sheets

OPTICAL FILTER

CROSS-REFERENCE TO RELATED APPLICATIONS

The present application is based on International Application No. PCT/EP2003/051068, filed on Dec. 18, 2003, which in turn corresponds to GB 02/29597.0 filed on Dec. 19, 2002, and priority is hereby claimed under 35 USC §119 based on these applications. Each of these applications are hereby incorporated by reference in their entirety into the present application.

FIELD OF THE INVENTION

The present invention relates to optical filters in the form of optical coatings applied to substrates. The present invention relates particularly, though not exclusively, to optical filters for photovoltaic cells, especially solar cells.

BACKGROUND OF THE INVENTION

Photovoltaic cells, such as solar cells, typically possess a preferential optical operating spectrum across/within which it is desired to have the photovoltaic cell operate. This may be because the design of the cell causes it to be relatively efficient in respect of, or to be relatively sensitive to, optical radiation within such a preferential spectrum. Alternatively, or additionally, it may be the case that optical radiation outside the operating spectrum is in some way detrimental to the operation of the cell.

For example, the efficiency of the photo-electrical conversion process of many photovoltaic cells falls as the temperature of the cell rises. Consequently, many solar cells employ filters designed to exclude from radiation incident upon the cell those wavelengths of radiation which have a propensity to heat the cell.

Typically, the filters are designed to reflect incident Infra-Red (IR) radiation. Other filters designed to exclude other types of optical radiation, such as Ultra-Violet (UV) radiation which may be damaging to certain components of the solar cell, may be employed. These other filters may be separate from the IR type filters. Alternatively, a single "band-pass" filter may be employed which is designed to simultaneously exclude not only IR radiation but also UV radiation from radiation incident upon a solar cell, but let "pass" through the filter optical radiation lying within a spectral band bounded by the excluded IR and UV radiations.

In general a silicon solar cell is operative responsive to radiation of wavelengths between 0.40 μm to 1.10 μm. Solar energy outside of this band is generally not converted into electricity and when absorbed only heats up the solar cell thereby reducing its efficiency. Certain types of optical band-pass filter comprise a multi-layer stack structure arranged upon a substrate, such as a glass substrate. Such multi-layer band-pass filters are designed to reflect IR radiation (or near-IR radiation) that lies immediately adjacent one side of a spectral band of radiation in respect of which a solar cell is intended to operate (e.g. 0.4 μm to 1.1 μm wavelengths), to transmit optical radiation lying within that spectral band and to reflect UV lying adjacent the other side of the spectral band of the solar cell.

The band-pass transmission spectra of such multi-layer filters is achieved by forming the stack of layers from repeating pairs of adjacent layers in which any one layer of a pair is comprised of material having an index of refraction which differs from the index of refraction of the other layer of the pair. Thus, the resulting multi-layer stack has an index of refraction which periodically jumps between two values as the depth of the multi-layer stack increases.

As is well known to those skilled in the art, the "optical thickness" of a layer is given by multiplying the physical thickness of the layer by the index of refraction of the material of the layer for a particular wavelength of optical radiation. Thus, a layer of constant physical thickness will have an optical thickness which depends upon the wavelength of optical radiation passing through it.

By appropriately controlling the physical thickness of each of the two layers in the repeated pair of layers such that each has an optical thickness equal to ¼ of a predetermined optical "design" wavelength (e.g. an IR wavelength), the multi-layer stack causes reflection of optical radiation to occur not only at (and around) the predetermined "design" wavelength, but also at (and around) other wavelengths corresponding to "higher order" frequencies equal to an odd-integer multiple of the "design" frequency. The result is known as a "¼-wave" stack, or "interference filter".

Thus, such a quarter-wave stack may be employed as an optical filter for reflecting IR radiation by selecting the predetermined wavelength to be a suitable IR wavelength such that a reflection band is formed adjacent a desired spectral pass-band. However, a drawback of such interference filters is that the aforementioned "higher order" reflection bands often reside well within the desired spectral pass-band. Thus, such filters may well reflect radiation which it is not desirable to reflect.

Other types of multi-stack optical interference filter have been proposed in which the multi-layer stack is composed of materials having three different refractive indices rather than just two. An example of that sort of optical filter is described in U.S. Pat. No. 6,107,564. By appropriately arranging the three different layer types in a repeating pattern within the stack of layers, the resultant structure is able to suppress the first few of the offending "higher order" reflection bands which usually occur in simple ¼-wave stacks as discussed above.

However, a common feature of the simple two-index ¼-wave stacks and of the aforementioned three-index stacks is the presence of a discontinuity in refractive index as between neighbouring stack layers. This discontinuity arises due to the sudden change in material (and optical properties thereof) at the interface between adjacent stack layers. Such discontinuities are detrimental to the performance and structure of the filter for the following reasons.

The strength of the multi-layer stack is sensitively dependent on the degree of interfacial adhesion between adjacent stack layers. Since adjacent layers in the aforementioned prior art devices are comprised of different materials, it is often the case that the differences (either chemical and/or physical) between such neighbouring layers reduce the strength of the interfacial bond which results in the interface being a primary site of structural weakness in the multi-layer stack.

Furthermore, in existing interference filters such as those described above, the transmission spectrum thereof at regions in between successive reflection bands are not uniformly transmissive. That is to say, although the reflection bands of such interference filters are generally mainly confined to a limited spectral band, they are in fact not fully so confined. Rather, the so-called reflection "bands" often possess significant ripples or transients of non-zero optical reflectance in the filter at spectral regions within the pass-band thereof.

This spreading/dispersion of the reflection band into the pass-band is principally due to the discontinuity in refractive index occurring at the interface of successive layers of a stack. It is detrimental to the transmission spectrum of such filters since it attenuates optical radiation which it is intended to pass to an underlying solar cell. Hence, solar cell efficiency is reduced.

SUMMARY OF THE INVENTION

It is an aim of the present invention to overcome at least some of the aforementioned deficiencies in the prior art. It is also an aim of the present invention to permit greater design flexibility when varying the structure of an optical filter in order to optimise its performance.

Accordingly, in a first of its aspects, the present invention may provide an optical filter including a substrate having a plurality of layers of materials stacked upon it each of which layers is formed from one or both of:

a first material having a first index of refraction; and, a second material having a second index of refraction being less than the first index of refraction;

wherein the plurality of layers of materials include a first layer and a second layer each and a third layer formed from the first material (H) being stacked in between the first layer and the second layer;

wherein the optical thickness of each of said first and said second layers is greater than the optical thickness of said third layer, characterized in that the first layer and second layers are each formed from an inhomogeneous mixture (M) of said first material (H) and said second material (L), in that the optical thickness of said first layer and of said second layer each differ in magnitude from the value 2Q by less than Q/2, and the optical thickness of said third layer differs in magnitude from the value Q by less than Q/2, where Q is the thickness of a given said layer traversed by substantially one quarter of a wavelength of optical radiation of a common reference wavelength at traversed by substantially one quarter of a wavelength of optical radiation of a common reference wavelength at which said optical thicknesses are determined, and in that all variations in the index of refraction (21 or 25 or 27; 23 or 26 or 28) of the first and second layer increase that index of refraction as the depth of the respective layer increases from regions thereof remote from said third layer to regions thereof proximate the third layer.

Due to the inhomogeneous mixing of the first material and the second material, when forming the first and second layers, the index of refraction of those layers varies with the depth of the layer between values greater than the second index of refraction and less than the first index of refraction.

Thus, by constructing an interference filter in the form of a multi-layer stack (on a substrate) comprising a repeating group of layers, the group including at least a relatively high refractive index layer sandwiched between two layers of varying (but lower) refractive index, one may for example, provide an interference filter which substantially reduces or suppresses ripples, oscillations or transients of non-zero optical reflectance that would otherwise tend to occur outside the main reflectance band, and "higher order" reflectance bands, of the multi-layer stack. That is to say, the transmission spectrum of the resulting multi-stack filter will tend to vary substantially more monotonically within/across the pass-band of the filter, or if not monotonically then will at least oscillate with lesser amplitudes therein.

Furthermore, the present invention is able to reduce or substantially remove any discontinuity in refractive index and material composition/structure as between adjacent layers of a multi-layer stack. Consequently, since a portion of an inhomogeneous layer immediately adjacent a neighbouring layer is materially very similar (or identical) to that neighbouring layer, the bonding of the two layers in question at their interface is enhanced thereby strengthening the multi-layer structure at that interface.

Indeed, it is to be understood that each of the "layers" of the optical filter of the present invention are formed from a particular choice of the proportions of the same two ingredient materials. The term "layer" used herein therefore refers to strata of differing material composition occurring in a continuously formed object whereby each strata corresponds to a particular composition(s) in the material forming the continuous object rather than corresponding merely to the collocation or joining of independent layers.

As will be well known to persons of skill in the art, the "optical thickness" of a layer of material is given by multiplying the physical thickness of the layer by the index of refraction of that layer. For layers of varying refractive index, the optical thickness is given by integrating the depth-dependent refractive index across the depth of the layer in question.

Preferably the optical thickness of the first layer and of the second layer each differ in magnitude from a value 2Q by less than Q/2, and the optical thickness of the third layer differs in magnitude from the value Q by less than Q/2, where Q is the optical thickness of a given said layer traversed by substantially ¼ of a wavelength of optical radiation of a common reference wavelength at which said optical thicknesses are determined.

It has been found that, starting from a basic design template in which the optical thicknesses of the first, third and second layers of a stack are respectively as follows: (2Q, Q, 2Q); one may optimise the performance of the filter by subsequently varying these three optical thicknesses during design of the filter and prior to its manufacture. This variation is, of course, achieved by varying the physical thickness of the relevant layers such that the associated optical thickness varies from the starting value of the basic design template by any suitable value provided that the variation in the value of the optical thickness is less than Q/2.

For example, the optical thickness of the first layer may be substantially equal to the optical thickness of the second layer, or the two said layers may differ in optical thickness. In either case, the optical thickness of the first and second layers may or may not be equal in value to 2Q depending upon whether or not design optimisation requires this.

Alternatively, the optical thickness of the first layer and of the second layer may each be substantially equal to the value 2Q. The optical thickness of the third layer may also be varied when optimising design performance and may be substantially equal to the value Q or may differ from that value by an amount less than Q/2.

Preferably the optical filter includes, within its plurality of layers, a pair of outer layers each being formed from the first material and between which are stacked the first, second and third layers. This results in a five-layer nest including the first, second and third layers sandwiched between the pair of outer layers.

The optical thickness of each of the outer layers preferably differs in value from the magnitude Q by less than Q/2. Thus, the optical thickness of the outer layers themselves may also individually be varied within the aforementioned limits in order to assist in optimising the performance of the filter as a whole. For example, the optical thickness of each one of the pair of outer layers may differ from each other or may substantially equal to each. Where the optical thickness of each of the outer layers is substantially equal, this common optical thickness may be equal to Q or may differ from Q (by less than Q/2).

It is to be understood that the term "inhomogeneous mixture" in respect of the mixing of materials of differing refractive index, is intended to refer to the nature of the relative proportions of mixed components (which form the mixture) being not homogeneous throughout at least part of the depth of the layer formed by the inhomogeneous mixture. The result of the inhomogeneity of the mixture is a variation of the refractive index of the layer so formed between different depth locations in the same layer.

The index of refraction of the first and/or second layer may vary continuously through at least a part of the depth of the respective layer. Alternatively, or additionally, the index of refraction of the first and/or one second layer may vary substantially in a step-wise manner through at least a part of the depth of the respective layer. In such an arrangement, the first and/or second layer may be a physically continuous article, not being physically discontinuous but having a spatial distribution (inhomogeneous) of mixture which causes sharp/rapid or substantially step-wise changes in the refractive index of the layer at certain regions of depth thereof where the mixture changes correspondingly sharply/rapidly or substantially in a step-wise way (or nearly so).

All variations in the index of refraction of the first and/or second layer may occur sharply/rapidly or substantially in a step-wise manner. In such a case the first and/or second layer may preferably comprise a plurality of sub-regions each of which is formed from a homogeneous mixture of the first material and the second material whereby the homogeneous mixture forming any one sub-region differs from the homogeneous mixture forming immediately neighbouring sub-regions within the intermediate layer such that the index of refraction of each of the plurality of sub-regions is substantially constant through the depth of the sub-region and the index of refraction of the respective first and/or second layer varies sharply/rapidly or substantially step-wise between successive sub-regions thereof.

This amounts to a "digitisation" of the variations in refractive index of the first/second layer. Once more, neighbouring sub-regions of the digitised first/second layer may be physically continuously formed within one physically continuous respective layer. However, by suitably controlling the inhomogeneous mixture of the two materials, one may cause the mixture to change substantially step-wise between neighbouring sub-regions thereby causing a corresponding "step" in the refractive index therebetween.

In such an arrangement, or in other arrangements, all variations in the index of refraction of the first and/or second layer may increase that index of refraction as the depth of the respective layer increases from regions thereof remote from the third layer to regions thereof proximate the third layer. Thus, for example, one may apply the aforementioned digitisation to a refractive index "ramp", or may have a smoothly varying refractive index ramp.

The plurality of layers are preferably arranged to form a stack of layers in which successive layers are arranged in a periodically repeating order across the depth of the stack.

The filter may be arranged to substantially reflect at least Infra-Red radiation and to transmit optical radiation at least in the visible optical spectrum. The filter may be arranged to substantially reflect at least Infra-Red radiation and Ultraviolet radiation.

The present invention may also provide a cover for a photovoltaic cell comprising a filter according to the first aspect of the invention, and may comprise a photovoltaic cell comprising such a cover. The photovoltaic cell is a preferably solar cell.

In a second of its aspects, the present invention may provide an optical filter including a substrate having a layer arranged upon it formed from an inhomogeneous mixture of:
  a first material having a first index of refraction; and,
  a second material having a second index of refraction being less than the first index of refraction; the inhomogeneous mixture being such that the value of the index of refraction of the layer oscillates with the depth of the layer between values greater than the second index of refraction and less than the first index of refraction. This may either be an alternative to, or may form a part of, a multi-layer stack type filter. In the former case, the oscillating variations in refractive index result in a filter having one main reflection band (which may be centred on an IR frequency) and has substantially no "higher order" type reflection bands. Since "higher order" reflection bands are suppressed in such a case, the filter is able to operate as an IR filter only with little or substantially no reflection of other wavelengths outside the single reflection band.

The oscillating variations of the value of the index of refraction of the layer, according to the invention in its second aspect, may include at least some sharp/rapid or substantially step-wise variations, or the variations may be mostly (or only) such sharp/rapid or substantially step-wise variations. In such a case the layer may preferably comprise a plurality of sub-regions each of which is formed from a homogeneous mixture of the first material and the second material whereby the homogeneous mixture forming any one sub-region differs from the homogeneous mixture forming immediately neighbouring sub-regions within the layer such that the index of refraction of each of the plurality of sub-regions is substantially constant with the depth of the sub-region and the index of refraction of the layer varies rapidly/sharply or substantially step-wise between successive sub-regions thereof.

In this way, the oscillating refractive index of the layer may be a partially, or wholly, "digitised" oscillation (e.g. a digitised wave shape) rather than a continuous oscillation (e.g. wave) as may be the case alternatively. An optical filter, according to the second aspect of the present invention, may form a filter for a photovoltaic cell such as a solar cell. For example, a solar cell may be formed having an optical filter comprising only an oscillating (e.g. wave) layer design (digitised or otherwise) according to the present invention in its second aspect. Alternatively, such a wave design could be bounded by other filter layers within a stack of filter layers according to the invention in its first aspect. For example, the wave design may be applied to any one or both of the first and second inhomogeneously mixed layers of the invention in its first aspect. Preferably, the wave design includes a quintic shape comprising one period of a sinusoid oscillation in the refractive index of a given layer across the whole width of the layer.

The optical filter, according to either the first or the second aspect of the present invention and any of their aforementioned preferred variants or alternatives, may be for a photovoltaic cell and such as a solar cell.

It will be readily appreciated that the present invention, in its first and second aspects and according to any or all of the above variants and preferable features, implements a method of producing an optical filter.

Accordingly, in a third of its aspects, the present invention may provide a method of producing an optical filter for use with a photovoltaic cell, the method including:

providing a substrate;

stacking a plurality of layers of materials upon the substrate each of which layers is formed from one or both of:

a first material having a first index of refraction; and, a second material having a second index of refraction being less than the first index of refraction;

including forming a first layer and a second layer of the plurality of layers, and forming from the first material a third layer of the plurality of layers being stacked between said first and second layers, wherein the optical thickness of each of said first and second layers is greater than the optical thickness of said third layer, characterized in that it includes forming the first layer and second layer from an inhomogeneous mixture of the first material and the second material, and wherein said first layer and said second layer are each formed with an optical thickness which differs in magnitude from the value 2Q by less than Q/2, and said third layer is formed with an optical thickness which differs in magnitude from the value Q by less than Q/2, where Q is the thickness of a given said layer traversed by substantially one quarter of a wavelength of optical radiation of a common reference wavelength at which said optical thicknesses are determined, and wherein the first and/or second layer is formed such that all variations in the index of refraction of the first and/or second layer increase that index of refraction as the depth of the respective layer increases from regions thereof remote from said third layer to regions thereof proximate the third layer.

Due to the inhomogeneous mixture of the first material and the second material when forming the first and second layers, the index of refraction of the first and second layer varies with the depth of the intermediate layers between values greater than the second index of refraction and less than the first index of refraction.

The first layer and second layer may be formed such that the optical thicknesses thereof differ, or such that the optical thicknesses thereof are substantially equal in value. Where the first layer and the second layer are each formed to have an optical thickness of equal value, this value may be substantially equal to 2Q, or may be equal to some other value differing from 2Q by less than Q/2. The third layer may be formed to have an optical thickness substantially equal to Q.

The method may include the step of forming a pair of outerlayers, being part of the plurality of layers, each being formed from the second material wherein the outer layers are formed with the first, second and third layers being stacked between them. The pair of outer layers may be formed such that the optical thickness of each such layer differs in value from the magnitude Q by less than Q/2. The optical thicknesses of each of the pair of outer layers may be substantially equal to each other, and may also be substantially equal to the value Q.

It is to be appreciated that variations in the optical thickness of one, some or all of the layers of the optical filter (including the first, second, third and outer layers) may be varied for the purposes of optimising the performance of the resultant filter. Consequently, the method, according to the invention in its third aspect, may include varying the optical thickness of one, some or all of the layers in said plurality of layers for the purpose of optimising the spectral response of the optical filter for: transmitting solar radiation within a band of wavelengths to which a solar cell is operatively designed to be sensitive to, and, for reflecting solar radiation outwith said band.

According to this method the first and/or second layer may be formed such that the index of refraction thereof varies continuously through at least a part of the depth of the respective layer.

Alternatively, or additionally the first and/or second may be formed such that index of refraction thereof varies substantially in a step-wise manner through at least a part of the depth of the respective layer.

The first and/or second layer may be formed such that all variations in the index of refraction thereof occur substantially in a step-wise manner.

The first and/or second layer may be formed to comprise a plurality of sub-regions each of which is formed from a homogeneous mixture of the first material and the second material whereby the homogeneous mixture forming any one sub-region differs from the homogeneous mixture forming immediately neighbouring sub-region within the first and/or second layer such that the index of refraction of each of the plurality of sub-regions is substantially constant with the depth of the sub-region and the index of refraction of the first and/or second layer varies substantially step-wise with depth between successive sub-regions thereof.

The first and/or second layer may be formed such that all variations in the index of refraction of the respective layer increase that index of refraction as the depth of the layer increases from regions thereof remote from the third layer to regions thereof proximate the third layer.

The plurality of layers are preferably arranged to form a stack of layers in which successive layers are arranged in a periodically repeating order across the depth of the stack.

The plurality of layers are preferably arranged to substantially reflect at least Infra-Red radiation and to transmit optical radiation at least in the visible optical spectrum.

The plurality of layers may be arranged to substantially reflect at least Infra-Red radiation and Ultra-violet radiation.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

Non-limiting examples of the present invention shall now be described with reference to the accompanying drawings in which:

FIG. 1 illustrates a transmission spectrum for a simple ¼-wave interference-type multi-stack optical filter, the spectrum comprising a main reflection band, and a "higher order" reflection band, and reflectance ripples/oscillations in between;

DETAILED DESCRIPTION OF THE INVENTION

Figure 1:
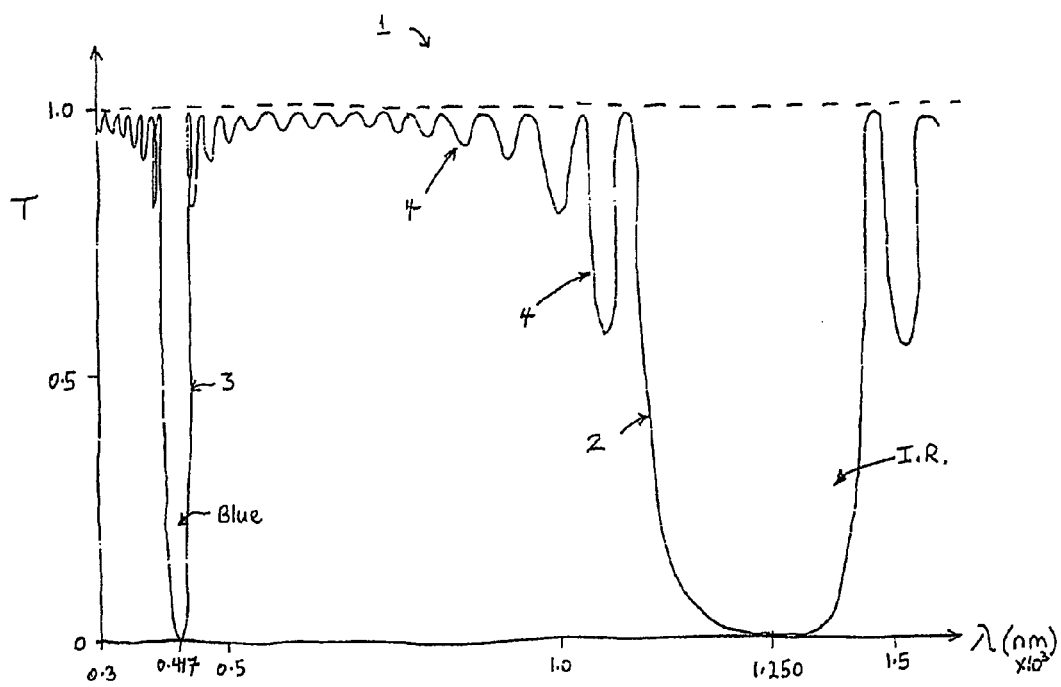

Referring to FIG. 1 there is illustrated a typical optical transmission spectrum 1 for a simple interference-type (or ¼-wave type) multi-layer stack optical filter of known type comprising a stack of layers of alternate high and low refractive index each layer being of an optical thickness equal to ¼ where $\lambda_0$ is a specified "design" wavelength (e.g. $\lambda_0$=1250 nm). The spectrum illustrates the variation in the optical transmission coefficient (T) of the filter as a function of incident optical radiation wavelength ($\lambda$) across a spectral region encompassing the operating bandwidth of a typical solar cell (e.g. from about 400 nm to about 1100 nm in optical wavelength).

The transmission spectrum 1 has a main broad reflection band 2 (i.e. low or zero transmission) centred at an optical wavelength of 1250 nm within the IR region of the optical spectrum, and a relatively narrow "higher order" reflection band 3 centred at an optical wavelength of 417 nm (i.e. 417=1250/3 approx.) within the blue/violet region of the optical spectrum and within the operating bandwidth of the solar cell. This "higher order" reflection band is the "third order" reflection band, the "second order" band (at $\lambda$=625 mm=1250/2) being suppressed and the "first order" band (at $\lambda$=1250 nm=1250/1) being present. A "fourth order" reflection band (at $\lambda$=312.5 nm=1250/4) is also suppressed.

The transmission spectrum 1 also possesses a series of optical transmission transients 4 occurring in between the main "first order" reflection band 2 and the "third order" reflection band 3, and beyond. These optical transmission transients 4 cause the transmission coefficient (T) of the optical filter to repeatedly fall significantly within the operating bandwidth of the solar cell. Both the third order reflection band 3 and the transmission transients 4 are undesirable since they exclude from use optical radiation which it is intended that the solar cell receives.

Figure 4:
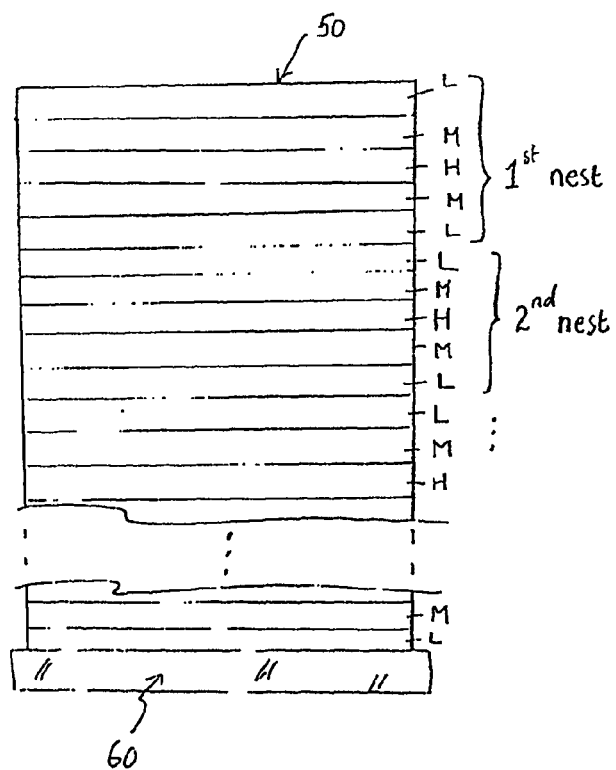
FIG. 4 illustrates a multi-layer optical filter comprising a stacked plurality of layer nests each nest being a multi-layer stack of the type illustrated in FIG. 2a, 2b or 2c.

FIG. 4 illustrates an interference-type multi-layer stack optical filter structure according to the present invention. The multi-layer optical filter comprises a multi-layer stack 50 arranged upon a CMG glass substrate 60 about 100 μm thick. The multi-layer stack 50 comprises a series of repeating layer groups (or "nests") each of which "nests" comprises a first and outer layer formed from a material (L) having a low refractive index (n). A succeeding second layer is formed from an inhomogeneous mixture (M) of the low-index material (L) and a different material (H) of a relatively high index of refraction. The second layer has a refractive index (n) which varies with the layer's depth this being achieved by the inhomogeneity (with layer depth) of the mixture (M) of the two materials (L and H) forming the layer. A succeeding third layer is formed from the high-index material (H) used in part to form the second layer. A succeeding fourth layer is formed from an inhomogeneous mixture (M) of the low-index material (L) and the height index material (H) such that the refractive index of the fourth layer varies with the depth thereof as a result of inhomogeneous mixing of H and L materials. A final fifth and outer layer is formed from the same material (L) used to form the first layer.

Thus, the refractive index profile of the five-layer "nest" of the stack 50 may be summarised as LMHML as indicated by the "1$^{st}$ nest" of FIG. 4. Each one of the first, third and fifth layers in the nest has an "optical" thickness of ¼-wavelength of a predetermined design wavelength (e.g. $\lambda_0$=340 nm). That is to say, when optical radiation of the predetermined design wavelength ($\lambda_0$) is propagating through any given one of the first, third or fifth layers within the nest, the wavelength of the radiation within that layer (which may differ from its wavelength as measured in a vacuum) is substantially four times greater than the layer thickness.

Conversely, each one of the second and fourth layers in the nest has an optical thickness of ½-wavelength of the predetermined design wavelength. Consequently, when optical radiation of the predetermined design wavelength ($\lambda_0$) is propagating through any given one of the second or fourth layers within the nest, the wavelength of the radiation within that layer is substantially two times greater than the layer thickness. The "2$^{nd}$ nest", and all successive nests, in the stack 50 merely repeat the layering structure of the "1$^{st}$ nest". In this example seven nests are stacked upon each other, but fewer or more nests may be so stacked.

FIG. 2 illustrates the refractive index profile of any one of the multiple five-layer nests illustrated in FIG. 4. The first and fifth layers (the outer layers) each have the same refractive index, 20 and 24 respectively, which is low (L) and homogeneous across the depth of the respective layer. The third layer has a refractive index, 22, which is high (H) and homogeneous across the depth of the layer.

Intermediate the first and third layer, and intermediate the third and fifth layers are the second and fourth layers formed of an inhomogeneous mixture of the materials used to form the first, third and the fifth layers, (20, 22 and 24 respectively). The inhomogeneous mixture of the two materials (L and H) in question results in a refractive index (21, 23) for the second and fourth layers respectively which varies continuously with the depth of the respective layer from the lower refractive index value (L), through continuously changing intermediate values to the higher refractive index value (H), the changing intermediate values being between the low value (L) associated with the first or fifth layer and the high value (H) associated with the third layer. The inhomogeneous second or fourth layer thus has a ramped refractive index which increases in value from regions thereof remote from the third layer to regions thereof proximate the third layer.

In terms of material types, the five-layer nest structure may be summarised as: (LM[ ]ML). However, in terms of layer optical thicknesses the five-layer nest may be referred to as follows: (Q, 2Q, Q, 2Q, Q)$^n$, where Q refers to ¼-wavelength of the predetermined design wavelength (e.g. $\lambda_0$=340 nm). The integer "n" refers to the number of times that the nest layer may be repeated in the optical stack design, in this example n=7.

It is to be noted that the optical thicknesses of successive layers illustrated in the designs of FIGS. 2a, 2b and 2c correspond with what may be termed a "template" or basic design arrangement which may subsequently be optimised by varying the optical thickness of one, some or all of the optical layers in one, some or all of the nests within a complete optical filter. It has been found that by varying the optical thickness of individual layers, or by varying layer optical thicknesses collectively, one may optimise the spectral response of the optical filter for the purposes of transmitting solar radiation within a band of wavelengths to which, for example, a solar cell is operatively designed to be sensitive to, and, for optimally reflecting solar radiation outwith that band.

It has been found that provided that the optical thickness of each of the second and fourth layers (being the inhomogeneously mixed layers) exceeds the optical thickness of the third (high-index) layer, and where present the outer (low-index) layers, by less than ⅛ of the design wavelength (i.e. by less than $\lambda_0$/8) then a suitable spectral response can be achieved in the optical filter.

Figure 2A:
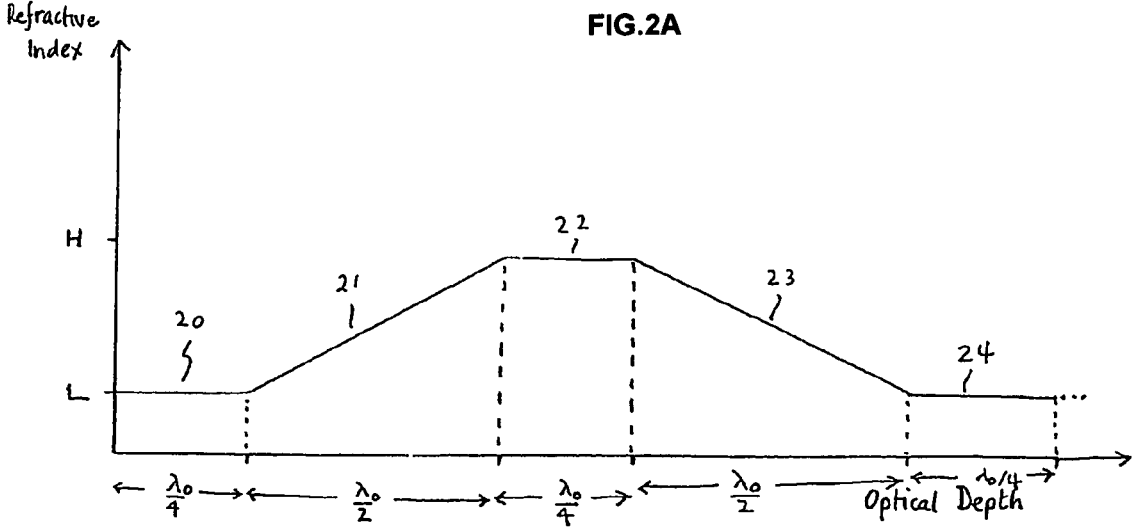
FIGS. 2a, 2b and 2c illustrate the variation in refractive index of a part of a multi-layer stack of an optical filter.
Figure 2B:
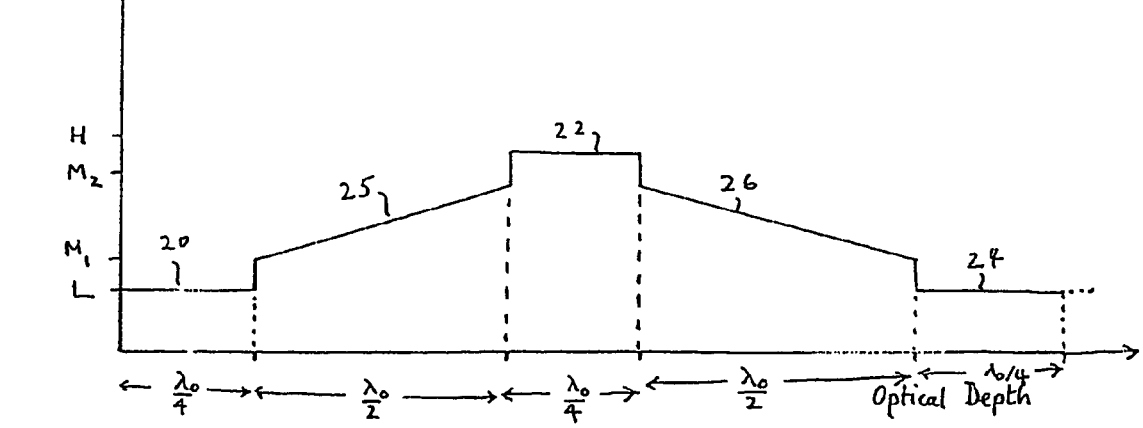
Figure 2C:
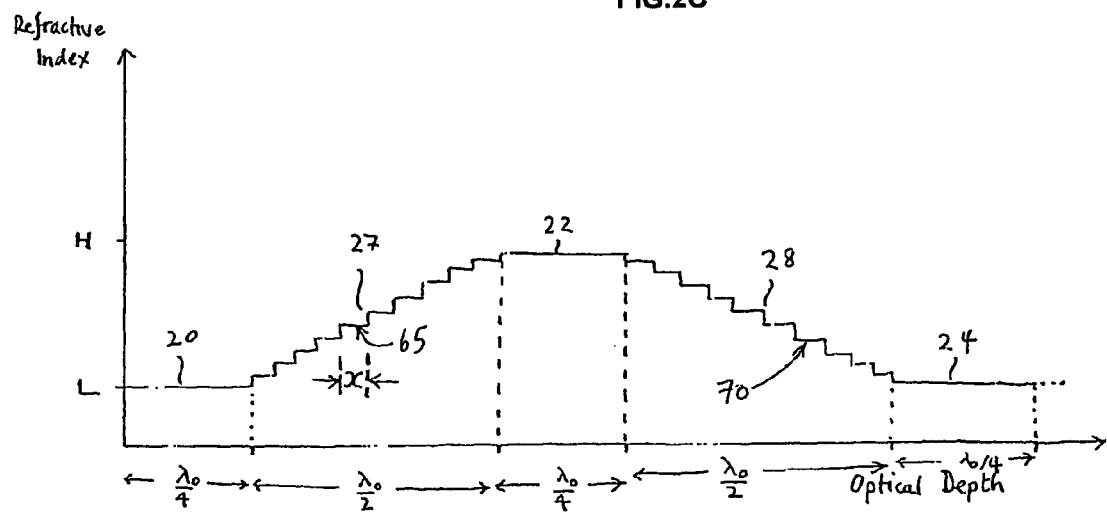
Figure 3:
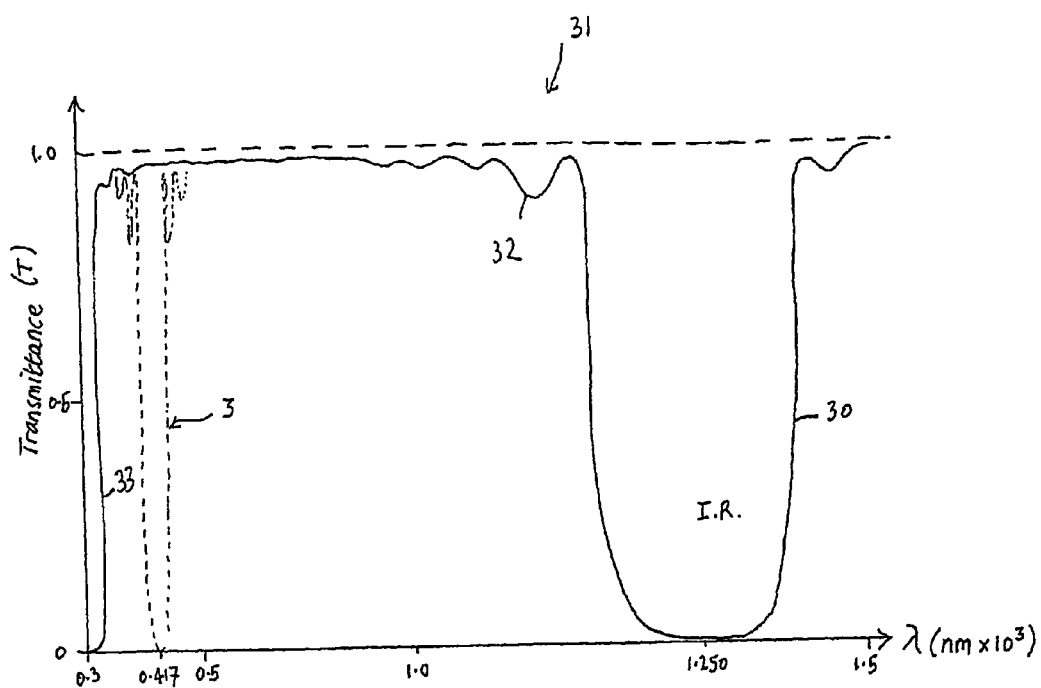
FIG. 3 illustrates a transmission spectrum for an interference-type multi-layer stack optical filter employing multi-layer stacks of the form illustrated in FIG. 2a, 2b or 2c.

Referring to FIG. 3 there is illustrated a transmission spectrum for a multi-stack optical filter comprising seven stacked five-layer nests of the form (Q, 2Q, Q, 2Q, Q) 7, each nest having a five-layer refractive index distribution of the form (LMHML) as illustrated in FIG. 2a, 2b or 2c. The spectrum of FIG. 3 comprises a main "first order" reflection band centred at a wavelength of 1250 nm and a fourth-order reflection band centred at a wavelength of 332.5 nm (i.e. 312.5=1250/4). It is to be noted that the region of the transmission spectrum intermediate the first order and fourth order reflection bands enjoys a high level of transmittance in which the presence of transmittance transients 32 is significantly suppressed. Furthermore, not only is the second-order reflection band completely suppressed at a wavelength of 625 nm (i.e. 625=1250/2), but also the third-order reflection band 3 centred at 417 nm (i.e. 417=1250/3) is suppressed. This is to be compared with FIG. 1 in which simple ¼-wave stacks are unable to suppress the third-order reflection band at 417 nm.

The basic transmission spectrum illustrated in FIG. 3 may be further improved by suitably optimising the design parameters employed in each of the seven nests of the optical filter with which the spectrum is associated. As mentioned above, this may involve suitable variations in the optical thicknesses of one, some or all of the five layers within each nest. For example, in terms of optical thicknesses, a nest may be modified to: (1.1Q, 2.3Q, 1.1Q, 2.3Q, 1.1Q). This variation is just one illustrative example of how relative thicknesses may be varied, and different variations may be applied to different nests in the multi-layer stack.

Furthermore, the gradient of the refractive index (i.e. the variation of refractive index as a function of layer depth) of one or both of the second and fourth inhomogeneously mixed layers of a given nest may also be varied in the procedure for optimising the spectral response of the filter. An example of this is shown in FIG. 2b wherein the second layer 25 and the fourth layer 26 each display a variation in refractive index which is reduced relative to that illustrated in FIG. 2a. In this example each of the inhomogeneously mixed layers is formed such that the refractive index of the layer varies from a lower intermediate value ($M_1$) which is greater in value than the low refractive index value associated with the first layer 20, to a second intermediate value ($M_2$) greater than the first intermediate value ($M_1$) but less than the high-index value associated with the third layer.

Indeed, it has been found that the mere presence of a distinctive ramping in the refractive indices of the second and fourth layer towards the third layer is sufficient to provide good optimisation of the spectral response of a filter, while the specifics of each ramp shape may subsequently be optimised to "fine-tune" the spectral response.

The form of the refractive index ramp in the second and/or fourth layers need not be linear, and may be exponentially increasing (as towards the third layer) or may be some other more complex ramp shape. Indeed, a quintic ramp shape may be employed in which the refractive index of either the second or fourth layer is formed so as to gently oscillate over a single sinusoid period, the quintic oscillation being superimposed upon an underlying ramp increase in the refractive index.

FIG. 2c illustrates a further design variant of the embodiments described herein, and shows the refractive index (n) variations of the inhomogeneously mixed second and fourth layers (27, 28) which vary substantially in a step-wise manner through the depth of the respective layer. In this arrangement, the second and fourth layer (27, 28) are each physically continuous articles, not being physically discontinuous but having a spatial distribution (inhomogeneous) of mixture (M) which causes substantially step-wise changes in the refractive index of the respective layer at certain sub-regions thereof where the mixture changes correspondingly substantially step-wise (or nearly so).

In this variant, the second/fourth layer comprises a plurality of sub-regions, such as sub-layers 65 and 70 of FIG. 2c, each of which is formed from a homogeneous mixture of the first material (L) and the second material (H) over a thickness "x" of the layer. The homogeneous mixture forming any one sub-region differs from the homogeneous mixture forming immediately neighbouring sub-region within the second/fourth layer (M) such that the index of refraction of each of the plurality of sub-regions is substantially constant with the depth "x" of the sub-region. However, the index of refraction of the second/fourth layer (M) varies substantially step-wise between successive sub-regions thereof. This amounts to a full "digitisation" of the variations in refractive index of the second and fourth layer.

Once more, it is to be noted that the neighbouring sub-regions of the digitised second/fourth layers are physically continuously formed within one physically continuous respective layer and do not represent separately formed sub-layers. However, by suitably controlling the inhomogeneous mixture of the two materials (L & H), one may cause the mixture to change substantially step-wise between neighbouring sub-regions thereby causing a corresponding "step" in the refractive index therebetween.

The "digitised" inhomogeneous refractive index profile illustrated in FIG. 2c may be applied in place of (or in addition to) the smoothly varying index ramps of the second and fourth layers of FIGS. 2a and 2b. Indeed, this has been found to be easier to achieve than a smoothly varying varying refractive index ramp.

An advantage of such digitisation is that the formation of such digitised shapes requires less control in the apparatus used to inhomogeneously mix the two differing materials employed in the mixture. The need to continuously regulate/vary the mixture is obviated when digitisation is employed.

Materials which may be employed in forming the layers of a multi-layer stack 50 of an optical filter (50, 60) according to the present invention include Silicon dioxide ($SiO_2$ and Hafnium dioxide ($HFO_2$) and a substrate glass 60 such as CMG glass.

For example, the following table illustrates an example of the physical thicknesses of each of the five layers in a given five-layer nest employed in a multi-nest stack. The outer first and fifth layers are each formed from Silicon dioxide, and the third high index layer is formed from Hafnium dioxide, while the second and fourth intermediate-index layers are formed from an inhomogeneous mixture of Silicon dioxide and Hafnium dioxide. The physical layer thicknesses indicated in the table below may be translated into optical thicknesses by multiplying the physical thickness with the refractive index of the material of the respective layer for the design wavelength of this example which is $\lambda_0$=340 nm.

The refractive indices at the design wavelength are as follows:
$SiO_2$—1.46;
$HfO_2$—2.09.

This gives physical thicknesses for the unmixed layers as:
$SiO_2$—58.2 nm;
$HfO_2$—40.6 nm,
for a design wavelength of 340 nm. The physical thickness of each ramped layer (layers 2 and 4) of inhomogeneously mixed materials $SiO_2$ & $HfO_2$ is 95.7 nm and in this example the refractive index of each of the two mixed layers (layers 2 and 4) ramps linearly from an index of 1.46 (adjacent an outer layer 1 or 5) to and index of 2.09 adjacent the high index layer 3.

| Layer | Material | Layer thickness(physical) nm |
|---|---|---|
| 0 | CMG GLASS | — |
| 1 | $SiO_2$ | 58.2 |

-continued

| Layer | Material | Layer thickness(physical) nm |
|---|---|---|
| 2 | SiO$_2$ & HfO$_2$ | 95.7 |
| 3 | HfO$_2$ | 40.6 |
| 4 | SiO$_2$ & HfO$_2$ | 95.7 |
| 5 | SiO$_2$ | 58.2 |

The above embodiments are intended to be examples of the present invention and variants and modifications of those embodiments, such as would be readily apparent to the skilled person, are envisaged and may be made without departing from the scope of the present invention.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. An optical filter including a substrate having a plurality of layers of materials stacked there upon, each of the layers formed from one or both of:
a first material having a first index of refraction; and,
a second material having a second index of refraction being less than the first index of refraction;
wherein the plurality of layers of materials includes a first layer and a second layer each and a third layer formed from the first material being stacked in between the first layer and the second layer;
wherein the optical thickness of each of said first and said second layers is greater than the optical thickness of said third layer;
wherein the first layer and second layers are each formed from an inhomogeneous mixture of said first material and said second material, wherein the optical thickness of said first layer and of said second layer each differ in magnitude from the value 2Q by less than Q/2, and the optical thickness of said third layer differs in magnitude from the value Q by less than Q/2, where Q is the thickness of a given said layer traversed by substantially one quarter of a wavelength of optical radiation of a common reference wavelength at which said optical thicknesses are determined, and wherein all variations in the index of refraction of the first and second layer increase that index of refraction as the depth of the respective layer increases from regions thereof remote from said third layer to regions thereof proximate the third layer.

2. An optical filter according to claim 1, wherein the optical thickness of said first layer is substantially equal to the optical thickness of said second layer.

3. An optical filter according to claim 1, wherein the optical thickness of said first layer and of said second layer are each substantially equal to 2Q, and the optical thickness of said third layer is substantially equal to Q.

4. An optical filter according to claim 1, wherein said plurality of layers of materials include a pair of outer layers each being formed from said second material (L) and between which are stacked said first, second and third layers.

5. An optical filter according to claim 1, wherein the optical thickness of each of said pair of outer layers differs in value from the magnitude Q by less than Q/2.

6. An optical filter according to claim 1, wherein the optical thickness of each one of the pair of outer layers is substantially equal to the optical thickness of the other of the pair of layers.

7. An optical filter according to claim 6, wherein the optical thickness of each of the outer layers is substantially equal to Q.

8. An optical filter according to claim 1, wherein the index of refraction of the first and/or second layer varies continuously through at least a part of the depth of the respective layer.

9. An optical filter according to claim 1, wherein the index of refraction of the first and/or second layer varies substantially in a step-wise manner through at least a part of the depth of the respective layer.

10. An optical filter according to claim 1, wherein all variations in the index of refraction of the first and/or second layer occur substantially in a step-wise manner.

11. An optical filter according to claim 10, wherein the first and/or second layer comprises a plurality of sub-regions stacked therein each of which is formed from a homogeneous mixture of the first material (H) and the second material (L) whereby the homogeneous mixture forming any one sub-region differs from the homogeneous mixture forming immediately neighbouring sub-region(s) within the first and/or second layer such that the index of refraction of each of the plurality of sub-regions is substantially constant with the depth of the sub-regions and the index of refraction of the first and/or second layer varies substantially step-wise with depth between successive sub-regions thereof.

12. An optical filter according to claim 1 in which the plurality of layers form a stack of layers in which successive layers are arranged in a periodically repeating order across the depth of the stack.

13. An optical filter according to claim 1, wherein the filter is arranged to substantially reflect at least Infra-Red radiation and to transmit optical radiation at least in the visible optical spectrum.

14. An optical filter according to claim 13, wherein the filter is arranged to substantially reflect at least Infra-Red radiation and Ultra-Violet radiation.

15. A cover for a photovoltaic cell comprising a filter according to claim 1.

16. A photovoltaic cell comprising a cover according to claim 15.

17. A photovoltaic cell according to claim 16, wherein the photovoltaic cell is a solar cell.

18. A method of producing an optical filter for use with a photovoltaic cell, the method including:
providing a substrate;
stacking a plurality of layers of materials upon the substrate, each of which layers is formed from one or both of:
a first material having a first index of refraction; and,
a second material having a second index of refraction being less than the first index of refraction;
including forming a first layer and a second layer of the plurality of layers, and forming from the first material a third layer of the plurality of layers being stacked between said first and second layers, wherein the optical thickness of each of said first and second layers is greater than the optical thickness of said third layer, and,
forming the first layer and second layer from an inhomogeneous mixture of the first material and the second material, and wherein said first layer and said second layer are each formed with an optical thickness which differs in magnitude from the value 2Q by less than Q/2, and said third layer is formed with an optical thickness which differs in magnitude from the value Q by less than Q/2, where Q is the thickness of a given said layer traversed by substantially one quarter of a wavelength of optical radiation of a common reference wavelength at which said optical thicknesses are determined, and wherein the first and/or second layer is formed such that all variations in the index of refraction of the first and/or second layer increase that index of refraction as the depth of the respective layer increases from regions thereof remote from said third layer to regions thereof proximate the third layer.

19. A method of producing an optical filter according to claim 18, wherein the optical thickness of said first layer is formed to be substantially equal to the optical thickness of said second layer and vice versa.

20. A method of producing an optical filter according to claim 19, wherein said first layer and said second layer are each formed to have an optical thickness substantially equal to 2Q, and said third layer is formed to have an optical thickness substantially equal to Q.

21. A method of producing an optical filter according to claim 20, further including the step of forming a pair of outer layers of the plurality of layers each being formed from said second material and between which are stacked said first, second and third layers.

22. A method of producing an optical filter according to claim 21, wherein said pair of outer layers are formed such that the optical thickness of each differs in value from the magnitude Q by less than Q/2.

23. A method of producing an optical filter according to claim 22, wherein each of said pair of outer layers is formed such that any one such layer has an optical thickness substantially equal to that of the other such layer.

24. A method of producing an optical filter according to claim 23, wherein each layer of the pair of outer layers is formed with an optical thickness substantially equal to Q.

25. A method of producing an optical filter according to claim 24, wherein the first and/or second layer is formed such that the index of refraction thereof varies continuously through at least a part of the depth of the respective layer.

26. A method of producing an optical filter according to claim 25, wherein the first and/or second layer is formed such that all variations in the index of refraction thereof occur substantially in a step-wise manner.

27. A method of producing an optical filter according to claim 25, wherein the first and/or second layer is formed such that index of refraction thereof varies substantially in a step-wise manner through at least a part of the depth of the respective layer.

28. A method of producing an optical filter according to claim 27, wherein the first and/or second layer is formed to comprise a plurality of sub-regions stacked therein each of which is formed from a homogeneous mixture of the first material and the second material whereby the homogeneous mixture forming any one sub-region differs from the homogeneous mixture forming immediately neighbouring sub-region(s) within the first and/or second layer such that the index of refraction of each of the plurality of sub-regions is substantially constant with the depth of the sub-regions and the index of refraction of the first and/or second layer varies substantially step-wise with depth between successive sub-regions thereof.

29. A method of producing an optical filter according to claim 18, wherein the method includes forming the plurality of layers into a stack of layers in which successive layers are arranged in a periodically repeating order across the depth of the stack.

30. A method of producing an optical filter according to claim 18, wherein the plurality of layers are arranged to substantially reflect at least Infra-Red radiation and to transmit optical radiation at least in the visible optical spectrum.

31. A method of producing an optical filter according to claim 30, wherein the plurality of layers are arranged to substantially reflect at least Infra-Red radiation and Ultra-Violet radiation.

32. A method of optical filtering of radiation incident thereof upon a photovoltaic cell, the method including;
producing an optical filter according to claim 18; and,
permitting incident radiation to pass through the plurality of layers so formed.

33. A method of producing an optical filter according to claim 18 including varying the optical thickness of one, some or all of the layers in said plurality of layers for the purpose of optimising the spectral response of the optical filter for: transmitting solar radiation within a band of wavelengths to which a solar cell is operatively designed to be sensitive to; and, for reflecting solar radiation outwith said band.

* * * * *